United States Patent
Lee et al.

(10) Patent No.: US 8,841,951 B2
(45) Date of Patent: Sep. 23, 2014

(54) APPARATUS FOR CONTROLLING DUTY RATIO OF SIGNAL

(71) Applicant: Electronics and Telecommunications Research Institute, Daejeon (KR)

(72) Inventors: Hui Dong Lee, Daejeon (KR); Jae Ho Jung, Daejeon (KR); Kwang Chun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/067,487

(22) Filed: Oct. 30, 2013

(65) Prior Publication Data

US 2014/0118045 A1    May 1, 2014

(30) Foreign Application Priority Data

Oct. 31, 2012  (KR) .................. 10-2012-0121973

(51) Int. Cl.
    *H03K 3/017*    (2006.01)
(52) U.S. Cl.
    CPC ...................................... *H03K 3/017* (2013.01)
    USPC .......................................... 327/175; 327/172
(58) Field of Classification Search
    None
    See application file for complete search history.

(56) References Cited

U.S. PATENT DOCUMENTS

| 5,889,828 A * | 3/1999 | Miyashita et al. ............. 375/374 |
| 7,302,026 B2 * | 11/2007 | Kaeriyama et al. ........... 375/355 |
| 2004/0150438 A1 | 8/2004 | Jung et al. |
| 2012/0007647 A1 | 1/2012 | Shim et al. |
| 2012/0105122 A1 | 5/2012 | Lee |
| 2012/0154006 A1 | 6/2012 | Ahn et al. |

FOREIGN PATENT DOCUMENTS

| KR | 10-2009-0126944 | 12/2009 |
| KR | 10-2010-0025789 | 3/2010 |

* cited by examiner

*Primary Examiner* — Cassandra Cox
(74) *Attorney, Agent, or Firm* — Nelson Mullins Riley & Scarborough LLP

(57) ABSTRACT

Disclosed is an apparatus for controlling a duty ratio of a signal that includes a clock control unit configured to generate a plurality of control signals based on an input signal, a half-cycle generation unit configured to generate a multiplied signal by use of the input signal and a delay signal that is obtained by delaying the input signal based on a delay control voltage, and divide the multiplied signal to generate a first division signal and a second division signal that are in inverse relation to each other, a comparator unit configured to compare a pulse width of the first division signal with a pulse width of the second division signal based on the control signal provided by the clock control unit, and output a delay control signal corresponding to a result of the comparison, and a control voltage generation unit configured to output a delay control voltage.

8 Claims, 6 Drawing Sheets

APPARATUS FOR CONTROLLING DUTY RATIO OF SIGNAL

CLAIM FOR PRIORITY

This application claims priority to Korean Patent Application No. 10-2012-0121973 filed on Oct. 31, 2012 in the Korean Intellectual Property Office (KIPO), the entire contents of which are hereby incorporated by reference.

BACKGROUND

1. Technical Field

Example embodiments of the present invention relate in general to a field of signal generation, and more particularly, to a duty ratio controlling apparatus for controlling a duty ratio at a predetermined ratio.

2. Related Art

A phase locked loop (PLL) circuit represents a circuit that consistently compares a reference clock with an output clock in phase, and based on the comparison result, corrects a frequency, so that the output clock maintains a constant frequency. The PLL circuit is one of basic circuits generally provided in an electronic system.

In general, the PLL circuit includes a phase frequency detector that compares a phase of an input clock signal with a phase of a comparison signal, a charge pump that provides a current signal having a level corresponding to the comparison result of the phase frequency detector, a loop filter that removes a high frequency component from the current signal provided by the charge pump and converts the current signal into a voltage signal to be output, a voltage controlled oscillator that outputs a clock signal having an oscillation frequency corresponding to the voltage signal provided by the loop filter, and a divider that divides the clock signal output from the voltage controlled oscillator by a predetermined divide ratio to generate a comparison signal, and provides the generated comparison signal to the phase frequency detector.

Due to the structure of such a PLL circuit, noise characteristics of an input signal used as an input to the PLL circuit exert a great influence on noise characteristics of an output signal of the PLL circuit.

Equation 1 describes noise characteristics of a phase of an output signal relative to an input clock signal in a PLL circuit.

$$L_{in\text{-}band} = L_{1Hz} + 20 \log(F_{pll}) - 10 \log(F_{ref}) \quad \text{[Equation 1]}$$

In Equation 1, $L_{in\text{-}band}$ represents a level of in-band phase noise, and $L_{1Hz}$ is a value, determined by a reference input signal, input into a PLL circuit, that is unchangeable on a circuit. In addition, $F_{ref}$ represents a frequency of the reference input signal, and $F_{pll}$ represents a frequency of an output signal of the PLL circuit. When assuming that a division factor of a divider included in the PLL circuit is N, a relation is established as $F_{pll} = F_{ref} \times N$.

Through Equation 1, it is known that the in-band noise of the PLL decreases when the frequency $F_{ref}$ of the reference input signal input into the PLL circuit is doubled.

Accordingly, in order to reduce the in-band noise of the PLL circuit, the frequency is doubled by multiplying the reference input signal. However, if a multiplier that multiplies the frequency of the reference input signal fails to precisely perform the multiplication, Equation 1 is not satisfied and the phase noise characteristics are more aggravated.

SUMMARY

Accordingly, example embodiments of the present invention are provided to substantially obviate one or more problems due to limitations and disadvantages of the related art.

Example embodiments of the present invention provide an apparatus for controlling a duty ratio of a signal that is capable of precisely and rapidly controlling the duty ratio of the signal at a desired value.

In some example embodiments, an apparatus for controlling a duty ratio includes a clock control unit, a half-cycle generation unit, a comparator unit, and a control voltage generation unit. The clock control unit may be configured to generate a plurality of control signals for controlling a duty ratio based on an input signal. The half-cycle generation unit may be configured to generate a multiplied signal by use of the input signal and a delay signal that is obtained by delaying the input signal based on a delay control voltage, and divide the multiplied signal to generate a first division signal and a second division signal that are in inverse relation to each other. The comparator unit may be configured to compare a pulse width of the first division signal with a pulse width of the second division signal based on the control signal provided by the clock control unit, and output a delay control signal corresponding to a result of the comparison. The control voltage generation unit may be configured to output a delay control voltage corresponding to the delay control signal.

The half-cycle generation unit may include a delay element, a gate, and a divider. The delay element may be configured to output the delay signal by adjusting a delay time of the input signal according to the delay control voltage. The gate may be configured to generate the multiplied signal having a frequency higher than a frequency of the input signal, based on the delay signal and the input signal. The divider may be configured to divide the multiplied signal to generate the first division signal and the second division signal, which are in inverse relation to each other, having the same frequencies as a frequency of the input signal.

The comparator unit may include a charging-discharging unit, a comparator, and a switching unit. The charging-discharging unit may be configured to generate a first comparison voltage and a second comparison voltage that correspond to the first division signal and the second division signal, respectively. The comparator may be configured to compare the first comparison voltage with the second comparison voltage, and output a result signal of the comparison in series. The switching unit may be configured to output the delay control signal having a predetermined number of bits based on the result signal of the comparison.

The charging-discharging unit may include pulse width-voltage converters configured to output voltages corresponding to pulse widths of the first division signal and the second division signal, respectively, the pulse width-voltage converters configured to be reset based on a reset signal provided by the clock control unit.

The comparator may output the result signal of the comparison based on a comparison control signal provided by the clock control unit.

The comparison control signal may have a frequency half a frequency of the input signal, and provided with pulses having the same number as the predetermined number of bits.

The switching unit may determine, as a most significant bit of the delay control signal, data that is first obtained among result signals of the comparison that are output from the comparator, and determine remaining bits of the delay control signal by sequentially obtaining respective pieces of data that are output as result signals of the following comparisons.

The control voltage generation unit may generate a plurality of voltages each having a different level by dividing a predetermined range of a voltage value based on a certain bit number, and output a voltage among the plurality of voltages that corresponds to the delay control signal as the delay control voltage.

As is apparent from the above description, with the apparatus for controlling the duty ratio of the signal, an input signal is multiplied to generate a multiplied signal, the generated multiplied signal is divided by 2 to generate two divide-by-2 signals each having the same frequency as a frequency of the input signal, pulse widths of the two divide-by-2 signals are compared with each other to generate a delay control voltage corresponding to the comparison result, and a delay time for the input signal is adjusted based on the generated delay control voltage such that a duty ratio is adjusted to 50%.

Accordingly, a clock signal having a duty ratio of accurately 50% is obtained at a high speed, and the obtained clock signal having the duty ratio of 50% is multiplied to obtain signals having frequencies thereof multiplied in various multiplications.

In addition, phase noise characteristics of the clock signals can be improved by use of the multiplied signals obtained as the above.

In addition, the duty ratio controlling apparatus in accordance with the embodiment of the present disclosure can be simply realized, and thus applied to all electronic circuits including a phase locked loop circuit and a frequency synthesizer.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Figure 1:
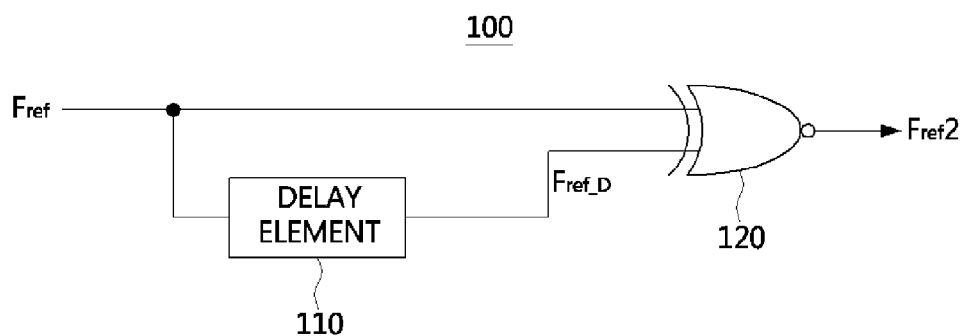
FIG. 1 is a circuit diagram illustrating a frequency multiplier of a signal.

Example embodiments of the present invention are disclosed herein. However, specific structural and functional details disclosed herein are merely representative for purposes of describing example embodiments of the present invention, and thus example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention. Like reference numerals refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in reverse order, depending upon the functionality/acts involved.

Hereinafter, embodiments of the present invention will be described in detail with reference to the accompanying drawings. For clarity, elements that appear in more than one drawing or in more than one place in the description are consistently denoted by the same respective reference numerals, and such elements are only described in detail once, to avoid redundancy.

Figure 2:
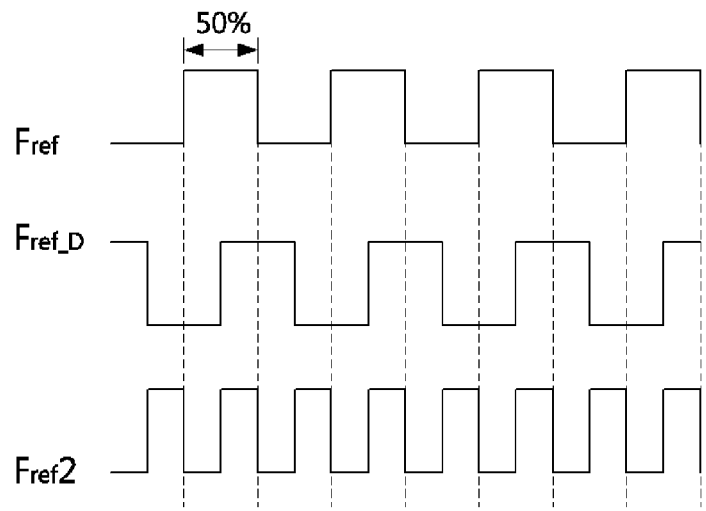
FIG. 2 is a timing diagram illustrating an operation of the frequency multiplier shown in FIG. 1.

FIG. 1 is a circuit diagram illustrating a frequency multiplier of a signal, and FIG. 2 is a timing diagram illustrating an operation of the frequency multiplier shown in FIG. 1.

Referring to FIGS. 1 and 2, a frequency multiplier 100 includes a delay element 110 that delays an input signal $F_{ref}$, and an EX-NOR gate 120 that performs an Exclusive NOR operation between a signal $F_{ref\_D}$ output from the delay element 110 and the input signal $F_{ref}$ to generate an output signal $F_{ref}2$ having a frequency twice a frequency of the input signal $F_{ref}$.

Meanwhile, in order to perform frequency multiplication such that the output signal $F_{ref}2$ has a frequency twice higher than that of the input signal $F_{ref}$, the input signal needs to have a duty ratio of accurately 50% as shown in FIG. 2. If a signal having a duty ratio other than 50% is input into the frequency multiplier 100, an output signal having a frequency twice that of the input signal may not be generated.

General examples of a frequency multiplication method include a frequency multiplication method by use of a differential amplifier end at a high frequency range, and a frequency multiplication method based on a locked loop by use of a plurality of delay elements to generate a signal having a duty ratio of 50%.

However, the frequency multiplication method using the differential amplifier end at the high frequency range is difficult to generate a signal having a duty ratio of exactly 50%, produces an output signal having small amplitude, and is easily changed in its characteristics by the operating environment.

In addition, the frequency multiplication method based on the locked loop by use of the plurality of delay elements has a poor stability, has a likelihood of being locked at an undesired frequency, and provides a complicated circuit configuration.

The present disclosure is to resolve the above described drawbacks encountered by such a general frequency multiplication method, and provides an apparatus for controlling a duty ratio that is capable of rapidly and precisely generating a signal having a duty ratio of 50%.

Figure 3:
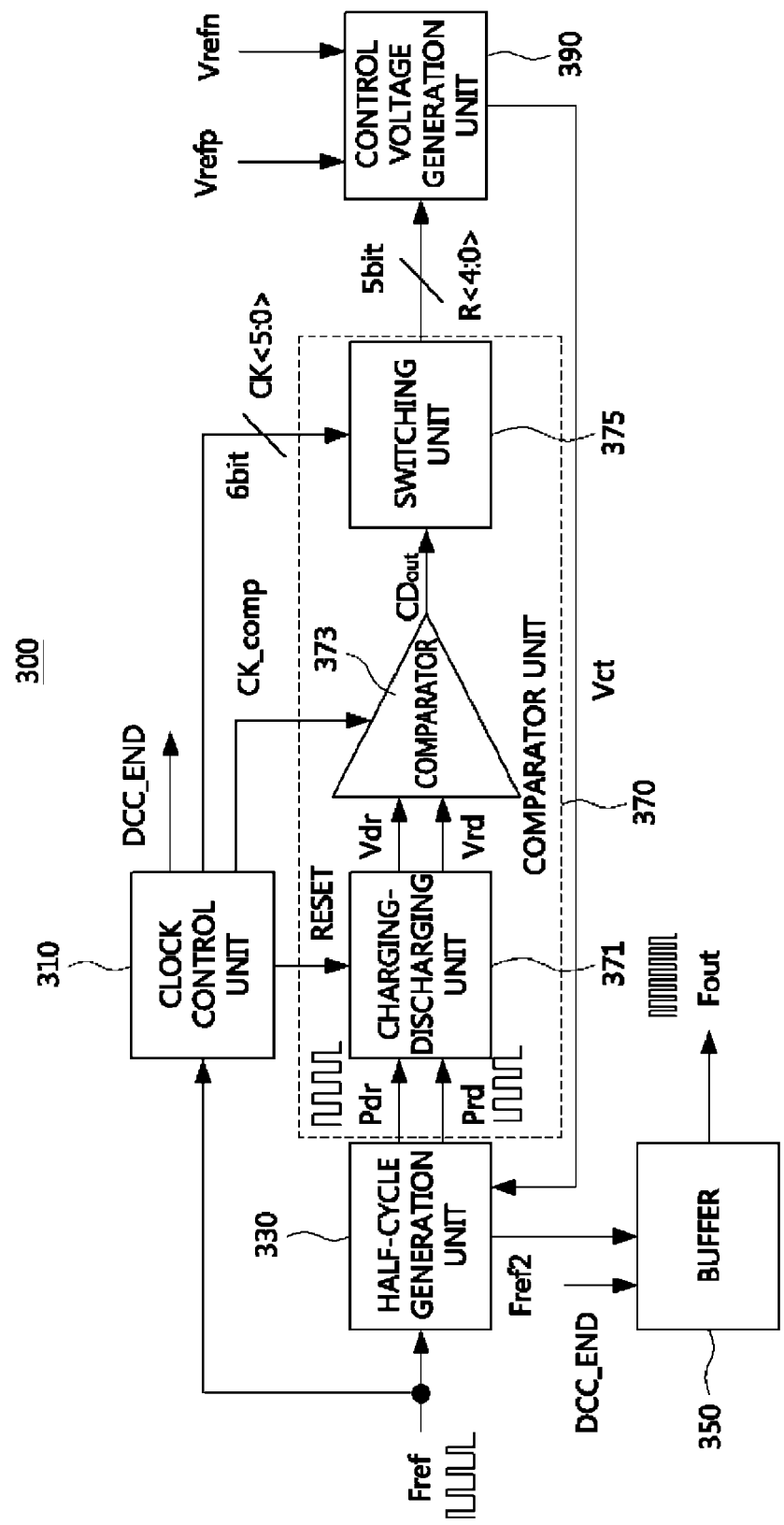
FIG. 3 is a block diagram illustrating a configuration of an apparatus for controlling a duty ratio in accordance with an embodiment of the present disclosure.

FIG. 3 is a block diagram illustrating a configuration of an apparatus for controlling a duty ratio in accordance with an embodiment of the present disclosure.

Referring to FIG. 3, a duty ratio controlling apparatus 300 includes a clock control unit 310, a half-cycle generation unit 330, a buffer 350, a comparator unit 370, and a control voltage generation unit 390.

The clock control unit 310, based on an input signal Fref provided to the clock control unit 310, provides a control signal to activate a duty control operation of the duty ratio controlling apparatus 300, as well as control signals to control operations of a charging-discharging unit 371, a comparator 373, and a switching unit 375 to the charging-discharging unit 371, the comparator 373, and the switching unit 375, respectively.

The half-cycle generation unit 330 internally generates a multiplied signal Fref2 having a frequency twice a frequency of the input signal Fref by adjusting a delay time of the input signal Fref2 based on a delay control voltage Vct provided by the control voltage generation unit 390, provides the buffer 350 with the generated multiplied signal Fref2, and divides the multiplied signal Fref2 by 2 to generate two divide-by-2 signals Pdr and Prd, having the same frequencies as that of the input signal Fref, which are in inverse relation to each other.

The multiplied signal Fref2 provided by the half-cycle generation unit 330 is provided as an output signal Fout after passing through the buffer 350.

The comparator unit 370, based on a control signal provided by the clock control unit 310, compares pulse widths of the divide-by-2 signals Pdr and Prd, which are provided by the half-cycle generation unit 330, with each other, and outputs a control code R<4:0> corresponding to a result of the comparison.

In detail, the comparator unit 370 is composed of the charging-discharging unit 371, the comparator 373, and the switching unit 375 so as to perform the above-described function.

The charging-discharging unit 371 is reset based on a reset signal RESET provided by the clock control unit 310, and outputs comparison voltages Vdr and Vrd, corresponding to the pulse widths of the divide-by-2 signals Pdr and Prd, which are provided by the half-cycle generation unit 330 in an inactivated section of the reset signal RESET.

The comparator 373 compares the comparison voltages Vdr and Vrd, which are provided by the charging-discharging unit 371, from each other according to a comparison control signal CK_comp provided by the clock control unit 310, and outputs a comparison signal CDout corresponding to a result of the comparison. Here, the comparison signal CDout is output in series, and has a logic 'HIGH' (or '1') or a logic 'LOW' (or '0') value.

The switching unit 375 performs a successive approximation algorithm according to a switching control signal CK<5:0> provided by the clock control unit 310, thereby outputting a control code R<4:0> corresponding to the comparison signal CDout that is provided in series by the comparator 373.

The control voltage generation unit 390 provides the half-cycle generation unit 330 with a delay control voltage Vct corresponding to the control code R<4:0> provided by the switching unit 375.

Referring to FIG. 3, the duty ratio controlling apparatus 300 in accordance with an embodiment of the present disclosure generates a multiplied signal Fref2 by multiplying an input signal Fref, divides the generated multiplied signal Fref2 by 2 to generate divide-by-2 signals Pdr and Prd that are in inverse relation to each other, generates a delay control voltage Vct according to a comparison result, that is, CDout obtained by comparing pulse widths (or logic HIGH sections) of the generated divide-by-2 signals Pdr and Prd with each other, delays the input signal Fref based on the generated delay control voltage Vct so as to generate a multiplied signal Fref2 and divide-by-2 signals Pdr and Prd such that the duty ratio is exactly adjusted to 50%.

Hereinafter, a circuit configuration and operation of each component of the duty ratio controlling apparatus 300 shown in FIG. 3 will be described in detail with reference to accompanied drawings.

Figure 4:
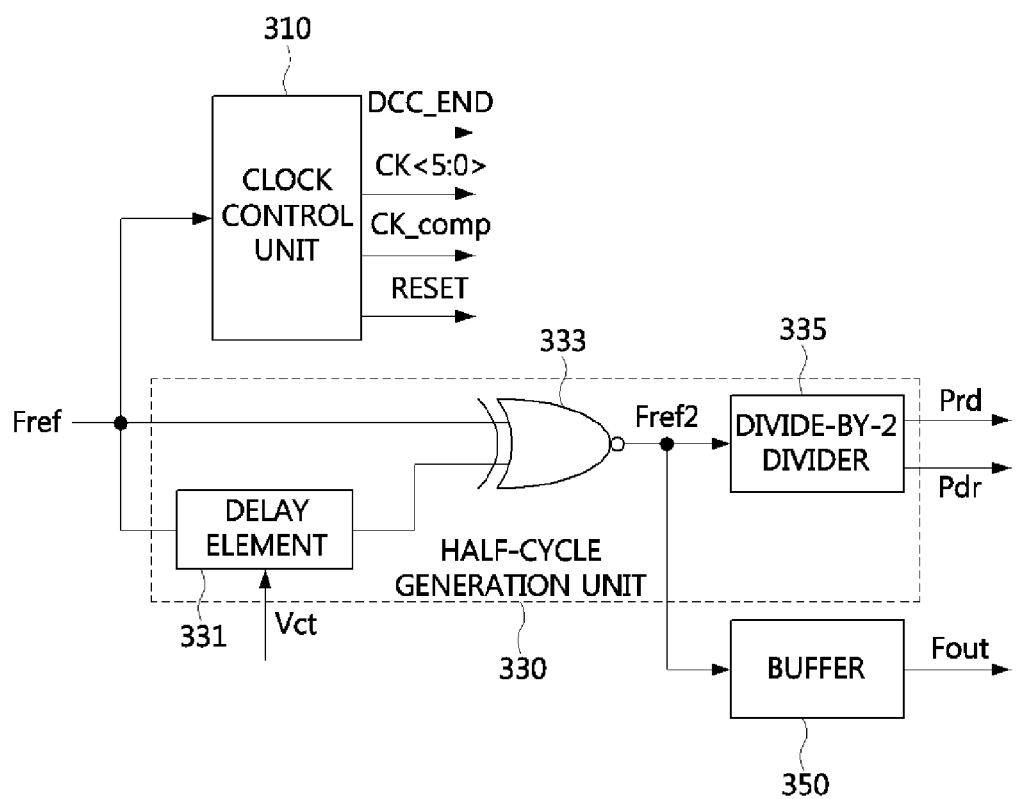
FIG. 4 is a detailed circuit diagram illustrating a clock control unit, a half-cycle generation unit, and a buffer that are shown in FIG. 3.

FIG. 4 is a detailed circuit diagram illustrating the clock control unit, the half-cycle generation unit, and the buffer that are shown in FIG. 3.

Referring to FIG. 4, the clock control unit 310 generates a reset signal RESET to control reset of the charging-discharging unit 371 based on an input signal Fref, and provides the generated reset signal RESET to the charging-discharging unit 371, and also generates a comparison control signal CK_comp for the comparator 373 to perform a comparison operation and provides the generated comparison control signal CK_comp to the comparator 373. Here, the reset signal RESET and the comparison control signal CK_comp may have the same frequencies each other while being inversed to each other. In addition, each of the reset signal RESET and the comparison control signal CK_comp may have a frequency half a frequency of the input signal Fref.

In addition, the clock control unit 310 may generate a switching control signal CK<5:0> that is a pulse signal having a logic HIGH during each period of the comparison control signal CK_comp according to a rising edge (or a positive transition) of the comparison control signal CK_comp, and provides the generated switching control signal CK<5:0> to the switching unit 375. In addition, the clock control unit 310 may generate a control activation signal DCC_END that is activated during a section for duty ratio adjustment to activate other control signals RESET, CK_com, and CK<5:0>. Here, if the control activation signal DCC_END is converted from an activated state to an inactivated state, the control signals RESET, CK_com, and CK<5:0> provided by the clock control unit 310 are inactivated, and accordingly, the duty ratio control operation ends.

The half-cycle generation unit 330 may include a delay element 331, an EX-NOR gate 333, and a divide-by-2 divider 335. The half-cycle generation unit 330 generates a multiplied signal Fref2 having a frequency higher than that of a provided input signal Fref, and divides the multiplied signal Fref2 by 2, to output divide-by-2 signals Pdr and Prd.

In detail, the delay element 331 adjusts a delay time of the input signal Fref corresponding to a delay control voltage Vct provided by the control voltage generation unit 390, and provides the delayed input signal Fref to the EX-NOR gate 333.

The EX-NOR gate 333 generates a multiplied signal Fref2 having a frequency higher than that of the input signal Fref by performing an Exclusive NOR operation between the input signal $F_{ref}$ and the delayed input signal provided by the delay element 331. Herein, the multiplied signal Fref2 may have a frequency twice higher than that of the input signal Fref.

Meanwhile, the multiplied signal Fref2 may be input into the divide-by-2 divider 335 while being provided to the buffer 350, and an output signal Fout output from the buffer 350 is provided to another circuit of the phase locked loop circuit, or to another apparatus.

The divide-by-2 divider 335 divides the multiplied signal Fref2 that is output from the EX-NOR gate 333 to output two divide-by-2 signals Pdr and Prd. Here, the two divide-by-2 signals Pdr and Prd are signals that have the same frequencies as that of the input signal Fref and are in inverse relation to each other. Accordingly, logic HIGH sections of the divide-by-2 signals Pdr and Prd do not overlap each other.

The duty ratio controlling apparatus 300 in accordance with an embodiment of the present disclosure compares lengths of logic HIGH sections (or pulse widths) of the two divide-by-2 signals Pdr and Prd, which are output from the half-cycle generation unit 330, with each other, and according to a result of the comparison, controls the delay time of the delay element 331, thereby providing a circuit for adjusting the duty ratio of a signal to 50%.

For example, in a case where the lengths of the logic HIGH sections of the two divide-by-2 signals Pdr and Prd are the same as each other, a signal Pdr or Prd having a duty ratio of 50% is obtained, and a signal Fref2 having a frequency multiplied twice that of the input signal is instantly obtained. Alternatively, in a case where the lengths of the logic HIGH sections of the two divide-by-2 signals Pdr and Prd are different from each other, the delay time of the delay element 331 is adjusted in response to the difference such that a signal having a duty ratio of 50% is obtained.

Figure 5:
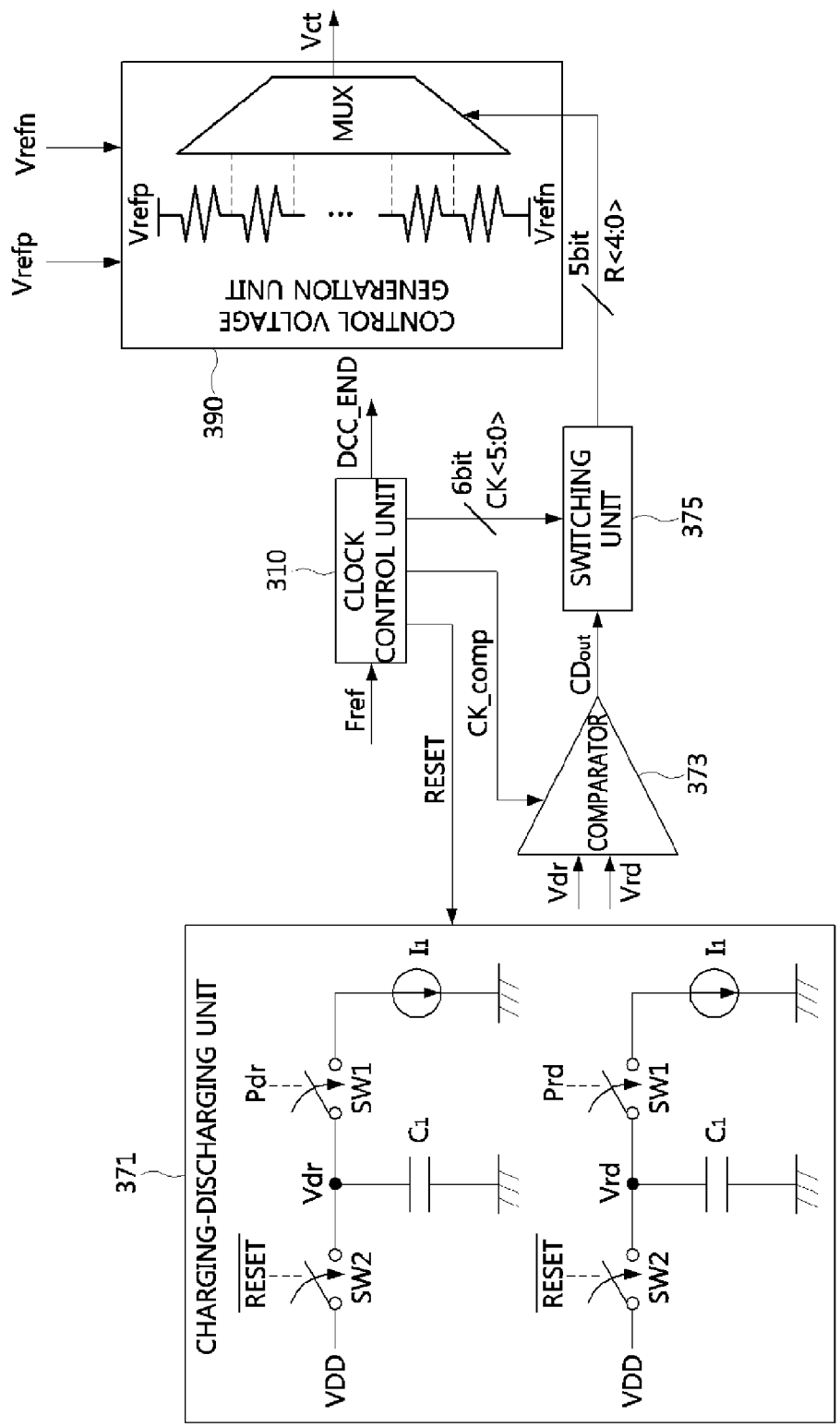
FIG. 5 is a detailed circuit diagram illustrating a comparator unit and a control voltage generation unit that are shown in FIG. 3.

FIG. 5 is a detailed circuit diagram illustrating the comparator unit and the control voltage generation unit that are shown in FIG. 3.

Referring to FIG. 5, the charging-discharging unit 371 outputs comparison voltages Vdr and Vrd corresponding to pulse widths (that is, logic HIGH sections) of the two divide-by-2 signals Pdr and Prd that are output in the form of pulses from the half-cycle generation unit 330.

To this end, the charging-discharging unit 371 may be composed of two pulse width-to-voltage converters. Each of the pulse width-to-voltage converters may include a capacitor $C_1$ and a current source $I_1$ that are connected to a power voltage VDD in parallel to the power voltage, and a switch SW1 and a switch SW2 to control the operation of the current source $I_1$ and the charging of the capacitor $C_1$, respectively. The switch SW1 of each pulse width-to-voltage converter is switched on or off in response to each of the divide-by-2 signals Pdr and Prd.

Hereinafter, the operation of the charging-discharging unit 371 will be described in detail. In a logic LOW section of each of the divide-by-2 signals Pdr and Prd, the switch SW1 is in an open state, and the switch SW2 is in an ON state, so that the capacitor $C_1$ is charged with the power voltage VDD. The switch SW2 is converted to an ON state or an OFF state in response to the reset signal RESET provided by the clock control unit 310. In accordance with an embodiment of the present disclosure, the switch SW2 is illustrated to become an ON state at a logic LOW section of the reset signal RESET as an example.

At logic HIGH sections of the divide-by-2 signals Pdr and Prd, the switch SW1 is in an ON state, and thus the current source $I_1$ operates. Accordingly, voltages of the capacitor $C_1$ Vdr and Vrd drop at a constant speed.

That is, the wider pulse widths (or logic HIGH sections) of the divide-by-2 signals Pdr and Prd are, the lower comparison voltages Vdr and Vrd are output from the charging-discharging unit 371 as the current flows for a longer period of time.

The comparator 373 compares the comparison voltages Vdr and Vrd, which are provided by the charging-discharging unit 371, with each other, and as a result of the comparison, outputs a comparison signal CDout that is a serial digital signal of a logic HIGH or a logic LOW. The comparison operation of the comparator 373 is performed to provide a delay element of the half-cycle generation unit 330 with a feedback of a control signal, that is, a delay control voltage Vct, configured to maintain pulse widths of the two divide-by-2 signals, output from the half-cycle generation unit 330, at the same pulse width.

The comparator 373 may perform the comparison operation in response to a rising edge of the comparison control signal CK_comp provided by the clock control unit 310. The comparison control signal CK_comp may have the same frequency as that of the reset signal RESET, and is provided in the form inversed to the reset signal RESET.

As described above, after the comparison operation of the comparator 373 is performed at the rising edge of the comparison control signal CK_comp, the reset signal RESET becomes a logic LOW, and thus the switch SW2 of the charging-discharging unit 371 is in an OFF state, and the comparison voltages Vdr and Vrd are charged with the power voltage VDD. Here, the reset signal RESET falls from a logic HIGH to a logic LOW after the comparison control signal CK_comp rises from a logic LOW to a logic HIGH.

For convenience sake of description, it is assumed that, Vdr is lower than Vrd if the comparison signal CDout output from the comparator 373 is a logic HIGH, and Vdr is higher than or equal to Vrd if the comparison signal CDout output from the comparator 373 is a logic LOW.

The switching unit 375 generates a control code R<4:0> corresponding to the comparison signal CDout output from the comparator 373, and provides the generated control code R<4:0> to the control voltage generation unit 390.

In detail, the switching unit 375 may be embodied to perform a successive approximation algorithm.

The switching unit 375 determines data that is obtained first among the comparison signals CDout output in series from the comparator 373, as a most significant bit (MSB) of the control code R<4:0>, and determines remaining bits of the control code R<4:0> by successively obtaining following pieces of data of the comparison signals CDout, thereby generating the control code R<4:0> composed of a predetermined number of bits. Herein, the control code R<4:0> may be composed of 5 bits, and in a process of obtaining the control code R<4:0> of 5 bits, the charging-discharging unit 371 is reset in response to the reset signal RESET that is provided by the clock control unit 310 at each point of time when digital data output from the comparator 373 is obtained, and a comparison signal CDout is output from the comparator 373 at each rising edge of the comparison control signal CK_comp. Such an operation including the resetting of the charging-discharging unit and the outputting of the comparison signal is repeated during the process of obtaining the control code R<4:0> of 5 bits.

For example, when assuming that the control code R<4:0> is set to have 5 bits, the switching unit 375 initializes all bits of the control code R<4:0> to '00000', and then sets an R<4> code corresponding to a most significant bit (MSB) to logic HIGH (or '1'), and determines a value of the R<4> code according to a comparison signal CDout. Thereafter, the switching unit 375 sets an R<3> code that is one bit next to the R<4> code to logic HIGH, and determines a value of the R<3> code according to a comparison signal CDout that is output as the comparator 373 performs a comparison operation. The switching unit 375 determines values of R<2>, R<1>, and R<0> codes in the same way as the above.

The parallel digital data output from the switching unit 375 becomes the control code R<4:0> that is to be provided to the control voltage generation unit 390.

The control voltage generation unit 390 outputs a delay control voltage Vct corresponding to the control code R<4:0> that is output from the switching unit 375.

In detail, the control voltage generation unit 390 is configured to have a plurality of resistors connected in series between different voltage sources Vrefp and Vrefn, so that a plurality of voltages each having a different level dropping through the respective resistors are provided as inputs into a multiplexer MUX, and to output a certain one of the plurality of voltages input into the multiplexer MUX as a delay control voltage Vct corresponding to the control code R<4:0>.

Here, the control voltage generation unit 390 may be configured in a way that a predetermined range of voltage (Vrefn~Vrefp; Vrefp>Vrefn) is divided by a certain number of bits B into 2B sections or 2B-1 sections such that a voltage value corresponding to the control code R<4:0> is output as a delay control voltage Vct. In addition, the delay control voltage Vct may be provided to be monotonously increased with increase of the control code R<4:0>. Alternatively, the delay control voltage Vct may be provided to be monotonously decreased with increase of the control code R<4:0>.

Through the configuration and operation of the duty ratio controlling circuit illustrated on FIGS. 3 to 5, the duty ratio controlling apparatus 300 in accordance with an embodiment of the present disclosure may generate a signal having a duty ratio of 50%.

Figure 6:
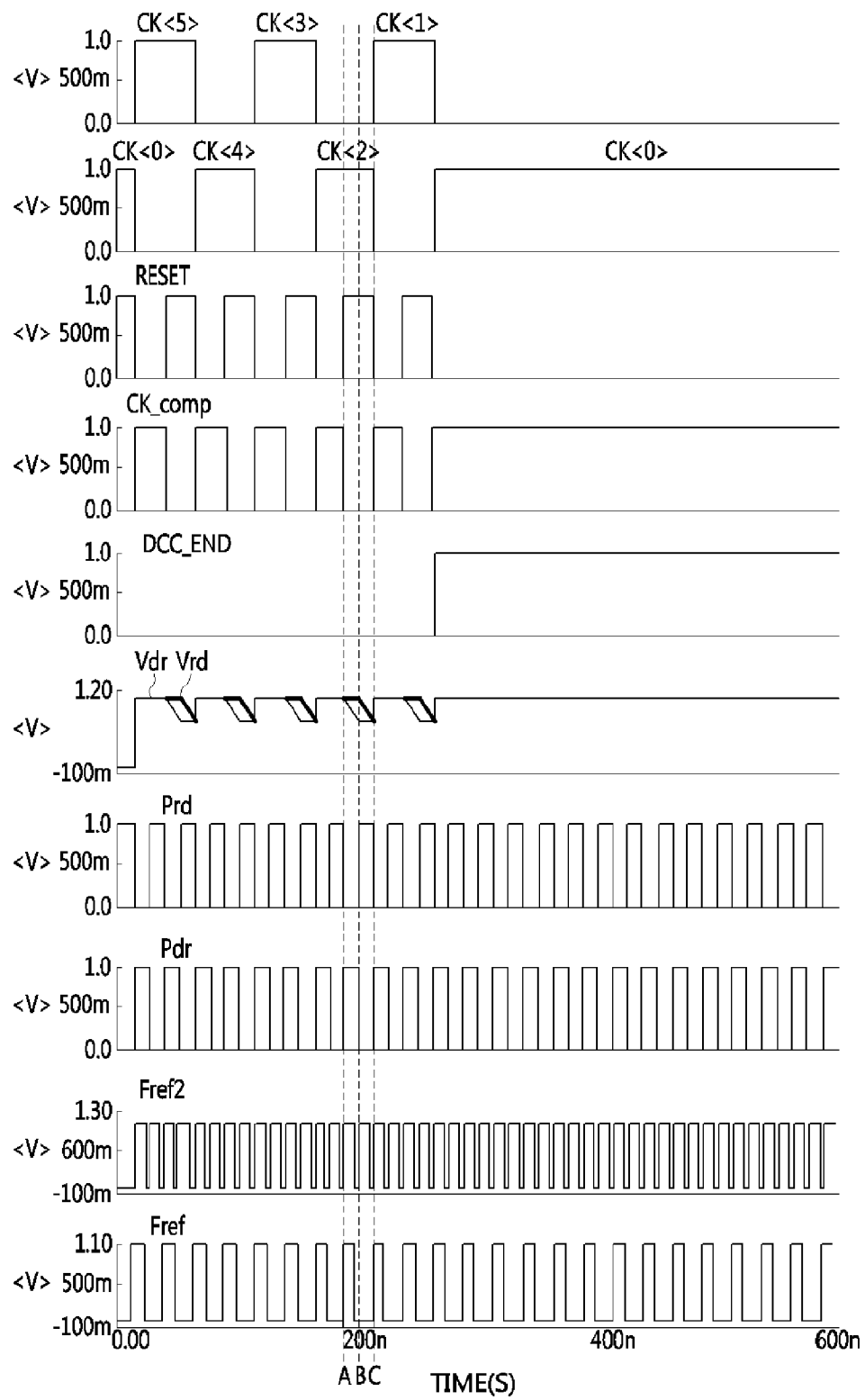
FIG. 6 is a timing diagram illustrating operations of the clock control unit, the half-cycle generation unit, and a charging-discharging unit that are shown in FIG. 3.

FIG. 6 is a timing diagram illustrating operations of the clock control unit, the half-cycle generation unit, and the charging-discharging unit that are shown in FIG. 3.

FIG. 6 shows an operational relation of the clock control unit 310, the half-cycle generation unit 330, and the charging-discharging unit 371 when an input signal Fref is input, while representing a relation among an input signal Fref, a multiplied signal Fref2, divide-by-2 signals Pdr and Prd, comparison voltages Vdr and Vrd, a control activation signal DCC_END, a comparison control signal CK_comp, a reset signal RESET, and a switching control signal CK<5:0>.

Referring to FIG. 6, the input signal Fref input into the half-cycle generation unit 330 is a signal having a duty ratio other than 50%. The half-cycle generation unit 330 generates the multiplied signal Fref2 having a frequency higher than that of the input signal Fref, and performs a division-by-2 on the generated multiplied signal Fref2 to output the divide-by-2 signals Pdr and Prd. Accordingly, the divide-by-2 signals Pdr and Prd have the same frequencies as that of the input signal Fref.

Meanwhile, the clock control unit 310 outputs the comparison control signal CK_comp when the control activation signal DCC_END is activated. The comparison control signal CK_comp is generated by performing a division-by-2 on the input signal Fref. In addition, the clock control unit 310 generates the reset signal RESET by allowing the comparison control signal CK_comp to pass through a short delay element to be inversed, and provides the generated reset signal RESET to the charging-discharging unit 371.

The control activation signal DCC_END is activated only at a section to obtain a predetermined number of bits of digital data, and inactivated after obtaining the desired digital data. In FIG. 6, an activated section of the control activation signal DCC_END is embodied as a logic LOW section, that is, an active low, and an inactivated section of the control activation signal DCC_END is embodied as a logic HIGH section as an example. However, the present disclosure is not limited thereto, and the control activation signal DCC_END may be conversely embodied to the above.

In order to adjust the duty ratio in accordance with an embodiment of the present disclosure, it is assumed that 5 bits of digital data of the comparison signal CDout are obtained, and accordingly, the comparison control signal CK_comp has 5 pulses generated at an activated section (a logic LOW section) of the control activation signal DCC_END, and then maintains a logic HIGH state.

That is, a logic HIGH state of the control activation signal DCC_END represents that the acquisition of digital data required for pulse width comparison of the divide-by-2 signals Pdr and Prd is completed, and when the control activation signal DCC_END is converted from logic LOW to logic HIGH, other control signals output from the clock control unit 310 become inactivated states.

In addition, the clock control unit 310 generates pulse signals each having logic HIGH during each period of the comparison control signal CK_comp according to a rising edge of the comparison control signal CK_comp, as the switching control signals CK<5:0>, including signals CK<5>, CK<4>, CK<3>, CK<2>, and CK<1>. Here, each pulse of the signals CK<5> to CK<1> is configured to be generated during a section corresponding to two periods of the input signal Fref. Meanwhile, the CK<0> is generated to keep in logic HIGH, instead of having a pulse.

Referring to a section ranging from point A to point C in a timing diagram of FIG. 6, the section from point A to point C corresponds to one period of the input signal Fref. During a section from point A to point B, a divide-by-2 signal Pdr is in a logic HIGH state, and thus a comparison voltage Vdr is decreased at a constant speed. On the other hand, during the section from point A to point B, a divide-by-2 signal Prd is in a logic LOW state, and thus a comparison voltage Vrd maintains the previous value.

Since the duty ratio controlling apparatus 300 in accordance with an embodiment of the present disclosure is implemented to use 5 bits in determining whether or not a duty ratio is 50%, 10 periods (that is, 5 bits×division-by-2=10 periods) of the input signal Fref are required to obtain digital data of 5 bits after the control activation signal DCC_END is activated.

However, the number of data bits required for duty ratio determination is not limited to 5 bits, and may be embodied in different numbers of bits.

The more bits are used, the more accurate duty ratio determination is possible; however, the comparison time for the duty ratio determination (or an activated section of the control activation signal DCC_END, 2×the number of bits×periods of the input signal) is increased. For example, when the frequency of an input signal Fref is 40 MHz and the number of bits desired to obtain is 5, the time required is 250 ns. The time as such is negligible when compared to the locking time of a phase locked loop. Accordingly, the duty ratio controlling apparatus in accordance with an embodiment of the present disclosure may achieve the duty ratio control at a high speed.

Figure 7:
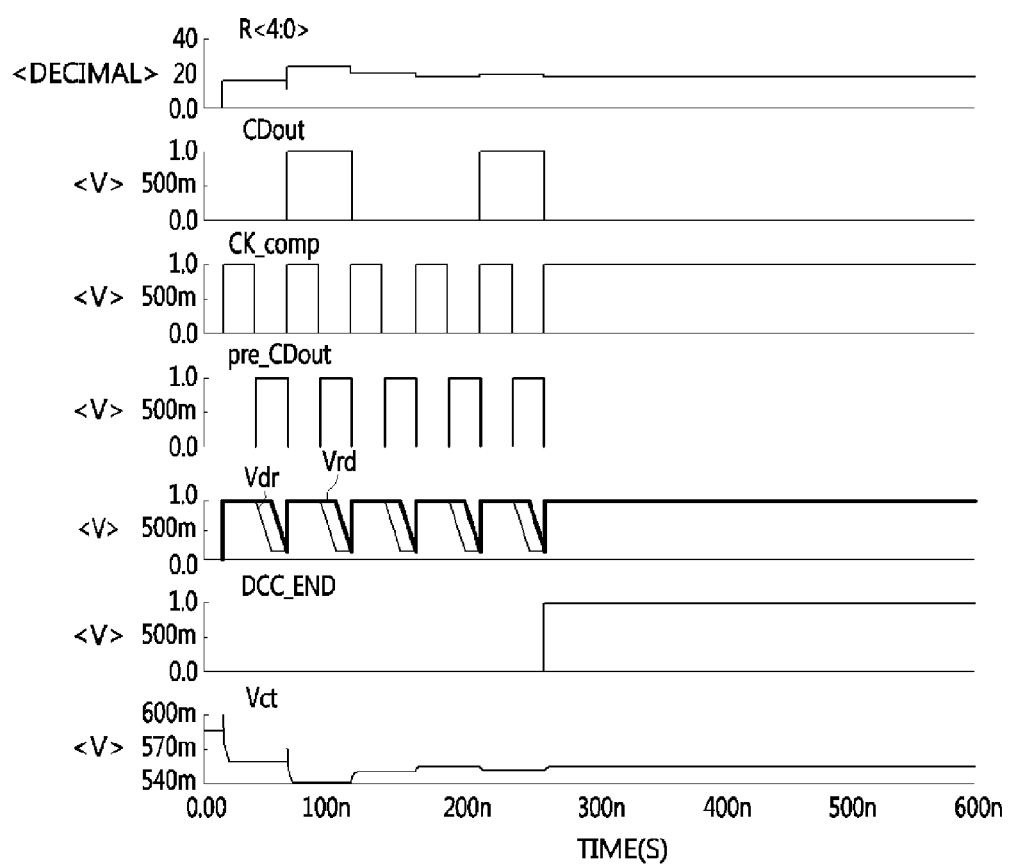
FIG. 7 is a timing diagram illustrating operations of a comparator, a switching unit, and the control voltage generation unit that are shown in FIG. 3.

FIG. 7 is a timing diagram illustrating operations of the comparator, the switching unit, and the control voltage generation unit that are shown in FIG. 3.

FIG. 7 shows a comparison value pre_CDout obtained as the comparator 373 compares a comparison voltage Vdr with a comparison voltage Vrd when the control activation signal DCC_END is activated, a comparison result signal CDout that is output by sampling the comparison value pre_CDout based on the comparison control signal CK_comp, a control code R<4:0> determined by the switching unit 375 based on the comparison result signal CD_out through a successive approximation algorithm, and a delay control voltage Vct corresponding to the control code R<4:0>.

Referring to FIG. 7, the comparison value pre_CDout represents a result obtained as the comparator 373 compares the comparison voltages Vdr and Vrd, provided from the charging-discharging unit 371, with each other, and the comparison value pre_CDout may be internally generated by the comparator 373. Here, the comparator 373, every point in time for comparison, compares the comparison voltages Vdr and Vrd with each other, and if Vdr<Vrd, outputs logic HIGH, and if not, outputs logic LOW.

In addition, the comparator 373 samples the comparison value pre_CDout at a rising edge of the comparison control signal CK_comp provided by the clock control unit 310, and outputs the sampling result as a comparison result signal CDout.

The switching unit 375 outputs a control code R<4:0> corresponding to comparison result signals CDout, which are successively input by the comparator 373, by use of the successive approximation algorithm.

Hereinafter, a process of outputting a control code R<4:0> performed by the switching unit 375 in a case in which the control code R<4:0> is composed of 5 bits (that is, in case of R<4:0>) will be described in detail.

First, the switching unit 375 maintains all bits of the control code R<4:0> at logic LOWs (that is, binary '00000' or decimal '0').

Thereafter, when the control activation signal DCC_END is activated, the switching unit 375 sets an MSB of the control code R<4:0> to a logic HIGH state, producing the control code R<4:0> of binary '10000' or decimal '16'.

In this state, if the comparator 373 outputs logic HIGH as a first comparison result signal CD_out, the switching unit 375 maintains the MSB, that is, R<4> at 1, and at the same time, sets a lower bit next to the MSB, that is, R<3> to logic HIGH. Accordingly, the control code R<4:0> is binary '11000' or decimal '24'.

Thereafter, if the comparator 373 outputs logic LOW as a second comparison result signal CD_out, the switching unit 375 changes the preset bit, that is, R<3> from 1 into 0, and set a next bit, that is, R<2> to 1. Accordingly, the control code R<4:0> is binary '10100' or decimal '20'.

Thereafter, if the comparator 373 outputs logic LOW as a third comparison result signal CD_out, the switching unit 375 changes the preset bit, that is, R<2> from 1 into 0, and set a next bit, that is, R<1> to 1. Accordingly, the control code R<4:0> is binary '10010' or decimal '18'.

Thereafter, if the comparator 373 outputs logic HIGH as a fourth comparison result signal CD_out, the switching unit 375 maintains the preset bit, that is, R<1> at 1, and sets a least significant bit (LSB), that is, R<0> to 1. Accordingly, the control code R<4:0> is binary '10011' or decimal '19'.

Thereafter, if the comparator 373 outputs logic LOW as a fifth comparison result signal CD_out, the switching unit 375 changes the preset LSB, that is, R<0> from 1 into 0. Accordingly, the control code R<4:0> is binary '10010' or decimal '18'.

Since the control activation signal DCC_END is inactivated after the comparator 373 outputs the fifth comparison result signal CD_out, the final control code R<4:0> is maintained at binary '10010' or decimal '18'.

Meanwhile, the control voltage generation unit 390 outputs the delay control voltage Vct corresponding to the control code R<4:0> provided by the switching unit 375.

Although the control voltage generation unit 390 in accordance with an embodiment of the present disclosure is illustrated to output the delay control voltage Vct getting smaller and to have a delay time getting shorter as the control code R<4:0> is getting larger, the present disclosure is not limited. According to another embodiment, the relation between the value of the control code R<4:0> and the delay control voltage Vct may be differently set.

The duty ratio controlling apparatus 300 in accordance with an embodiment of the present disclosure can generate a signal having a duty ratio of 50% by performing the above-described process, and also easily obtain a signal having a frequency twice that of the input signal through a simple delay element and a gate (EX-NOR or EX-OR).

In addition, using a multiplied signal having a frequency doubled as a reference input signal of the PLL circuit, the in-band noise level of the PLL circuit is reduced and the jitter is improved, so that the overall performance of the system is further improved.

While the example embodiments of the present invention and their advantages have been described in detail, it should be understood that various changes, substitutions, and alterations may be made herein without departing from the scope of the invention.

What is claimed is:

1. An apparatus for controlling a duty ratio, the apparatus comprising:
 a clock control unit configured to generate a plurality of control signals for controlling a duty ratio based on an input signal;
 a half-cycle generation unit configured to generate a multiplied signal by use of the input signal and a delay signal that is obtained by delaying the input signal based on a delay control voltage, and divide the multiplied signal to generate a first division signal and a second division signal that are in inverse relation to each other;
 a comparator unit configured to compare a pulse width of the first division signal with a pulse width of the second division signal based on the control signal provided by the clock control unit, and output a delay control signal corresponding to a result of the comparison; and
 a control voltage generation unit configured to output a delay control voltage corresponding to the delay control signal.

2. The apparatus of claim 1, wherein the half-cycle generation unit comprises:
   a delay element configured to output the delay signal by adjusting a delay time of the input signal according to the delay control voltage;
   a gate configured to generate the multiplied signal having a frequency higher than a frequency of the input signal, based on the delay signal and the input signal; and
   a divider configured to divide the multiplied signal to generate the first division signal and the second division signal, which are in inverse relation to each other, having the same frequencies as a frequency of the input signal.

3. The apparatus of claim 1, wherein the comparator unit comprises:
   a charging-discharging unit configured to generate a first comparison voltage and a second comparison voltage that correspond to the first division signal and the second division signal, respectively;
   a comparator configured to compare the first comparison voltage with the second comparison voltage, and output a result signal of the comparison in series; and
   a switching unit configured to output the delay control signal having a predetermined number of bits based on the result signal of the comparison.

4. The apparatus of claim 3, wherein the charging-discharging unit includes pulse width-voltage converters configured to output voltages corresponding to pulse widths of the first division signal and the second division signal, respectively, the pulse width-voltage converters configured to be reset based on a reset signal provided by the clock control unit.

5. The apparatus of claim 3, wherein the comparator outputs the result signal of the comparison based on a comparison control signal provided by the clock control unit.

6. The apparatus of claim 5, wherein the comparison control signal has a frequency half a frequency of the input signal, and provided with pulses having the same number as the predetermined number of bits.

7. The apparatus of claim 3, wherein the switching unit determines, as a most significant bit of the delay control signal, data that is first obtained among result signals of the comparison that are output from the comparator, and determines remaining bits of the delay control signal by sequentially obtaining respective pieces of data that are output as result signals of the following comparisons.

8. The apparatus of claim 1, wherein the control voltage generation unit generates a plurality of voltages each having a different level by dividing a predetermined range of a voltage value based on a certain bit number, and outputs a voltage among the plurality of voltages that corresponds to the delay control signal as the delay control voltage.

* * * * *